United States Patent
Wall et al.

(10) Patent No.: US 10,128,330 B1
(45) Date of Patent: Nov. 13, 2018

(54) SEMICONDUCTOR DEVICE WITH A BURIED JUNCTION LAYER HAVING AN INTERSPERSED PATTERN OF DOPED AND COUNTER-DOPED MATERIALS

(71) Applicant: SEMICONDUCTOR COMPONENTS INDUSTRIES, LLC, Phoenix, AZ (US)

(72) Inventors: Ralph N. Wall, Pocatello, ID (US); Meng-Chia Lee, Pocatello, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/655,532

(22) Filed: Jul. 20, 2017

(51) Int. Cl.
| | |
|---|---|
| H01L 29/739 | (2006.01) |
| H01L 29/06 | (2006.01) |
| H01L 29/78 | (2006.01) |
| H01L 29/66 | (2006.01) |
| H01L 29/15 | (2006.01) |
| H01L 29/10 | (2006.01) |

(52) U.S. Cl.
CPC ...... *H01L 29/0623* (2013.01); *H01L 29/1095* (2013.01); *H01L 29/158* (2013.01); *H01L 29/66333* (2013.01); *H01L 29/66712* (2013.01); *H01L 29/7395* (2013.01); *H01L 29/7802* (2013.01)

(58) Field of Classification Search
CPC ................... H01L 29/7395; H01L 21/823487
See application file for complete search history.

(56) References Cited

U.S. PATENT DOCUMENTS 6,037,632 A * 3/2000 Omura ................... H01L 21/74
257/139

* cited by examiner

*Primary Examiner* — Mark Prenty
(74) *Attorney, Agent, or Firm* — Ramey & Schwaller, LLP

(57) ABSTRACT

A semiconductor device having a novel buried junction architecture. The semiconductor device may have three terminals and a drift region between two of the terminals. The drift region includes an upper drift layer, a lower drift layer, and a buried junction layer between the upper and lower drift layers, wherein the upper and lower drift layers have a first type of doping. The buried junction layer comprises an interspersed pattern of a first material and a second material, the first material having a second type of doping opposite the first type of doping and the second material having the first type of doping and having a different doping concentration than the upper and lower drift layers.

6 Claims, 8 Drawing Sheets

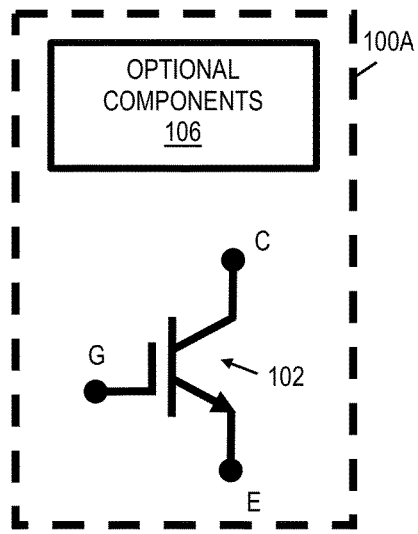
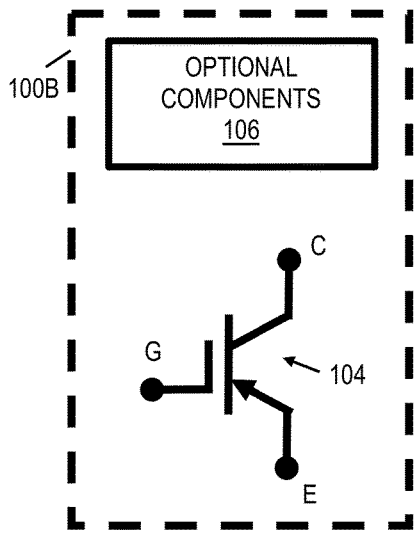
N-channel IGBT with buried junction layer having an interspersed pattern of doped and counter-doped materials
FIG. 1A
P-channel IGBT buried junction layer having an interspersed pattern of doped and counter-doped materials
FIG. 1B
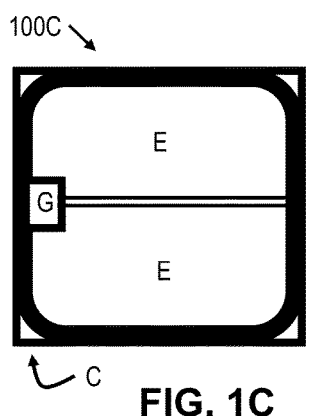
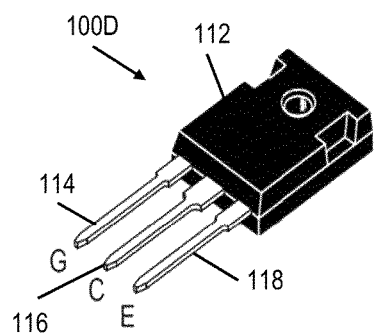
FIG. 1C
FIG. 1D

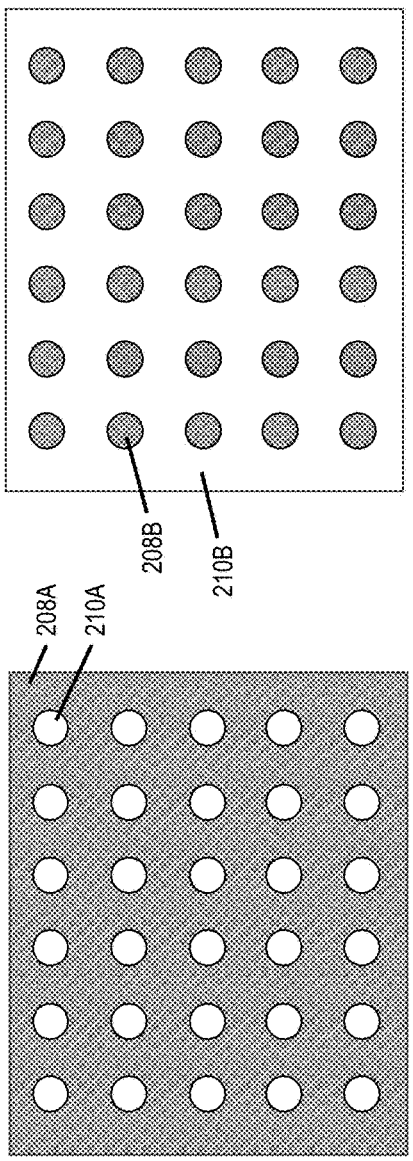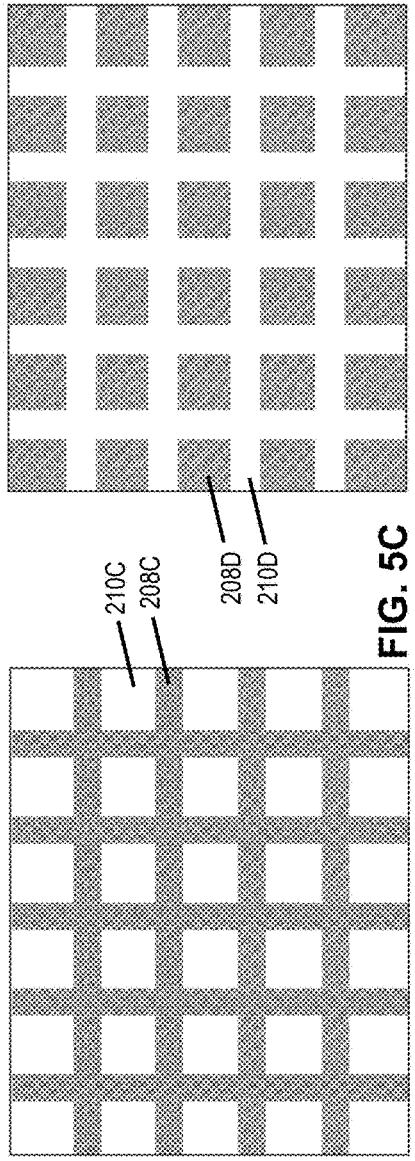

SEMICONDUCTOR DEVICE WITH A BURIED JUNCTION LAYER HAVING AN INTERSPERSED PATTERN OF DOPED AND COUNTER-DOPED MATERIALS

BACKGROUND

Power transistors are semiconductor devices employed for switching power on and off. Different power transistor configurations are available, including insulated-gate bipolar transistors (IGBTs). The IGBT design combines the output switching and conduction characteristics of a bipolar transistor with the voltage-control of a MOSFET. IGBTs are often employed in, but are not limited to, scenarios involving low duty cycle, low frequency (e.g., below 20 kHz), high-voltage (e.g., above 1000 Volts), high temperature (e.g., above 100° Celsius), and/or high output power (e.g., above 5 kW).

Some of the issues that negatively impact IGBTs include switching losses and performance degradation over time due to thermal cycling. Recent efforts to improve IGBT characteristics include the introduction of a buried junction (sometimes called "floating" junction or "super" junction) into the drift region. Efforts to improve buried junction design and/or manufacturing techniques are ongoing. Buried junction architectures and improvements thereof are applicable to IGBTs as well as other semiconductor devices.

SUMMARY

Accordingly, there is provided herein a semiconductor device having a novel buried junction architecture. In at least some embodiments, a semiconductor device has three terminals and a drift region between two of the terminals. The drift region includes an upper drift layer, a lower drift layer, and a buried junction layer between the upper and lower drift layers, wherein the upper and lower drift layers have a first type of doping. The buried junction layer comprises an interspersed pattern of a first material and a second material, the first material having a second type of doping opposite the first type of doping and the second material having the first type of doping and having a different doping concentration than the upper and lower drift layers.

In at least some embodiments, a method for manufacturing semiconductor devices includes forming a lower drift region having a first type of doping. The method also includes forming a junction layer over the lower drift region, wherein the junction layer comprises an interspersed pattern of a first material and a second material, the first material having a second type of doping opposite the first type of doping and the second material having the first type of doping and having a different doping concentration than the lower drift region. The method also includes forming an upper drift region over the junction layer, the upper drift region having the first type of doping and having a different doping concentration than the first material.

Each of the foregoing embodiments may be implemented in combination and/or may include one or more of the following features in any combination: (a) the drift region comprises a plurality of buried junction layers with an intermediate drift layer between adjacent buried junction layers, wherein each buried junction layer comprises an interspersed pattern of a first material and a second material, the first material having a second type of doping opposite the first type of doping and the second material having the first type of doping and having a different doping concentration than the upper and lower drift layers; (b) the interspersed patterns corresponding to the plurality of buried junction layers are aligned; (c) the interspersed patterns corresponding to the plurality of buried junction layers are not aligned; (d) the interspersed pattern comprises spaced islands of the first material separated by the second material; (e) the interspersed pattern comprises spaced lines of the first material separated by the second material; (f) at least some of the spaced lines intersect each other; (g) the spacing of interspersions within an active region is constant, and the spacing of interspersions outside the active region are increased relative the spacing of interspersions within the active region; h) the spacing of interspersions outside an active region continually increase as a function of distance from the active region; (i) the interspersed pattern of the first material and the second material is designed to avoid current filamentation during device turn-off; (j) forming a plurality of junction layers with an intermediate drift region between adjacent junction layers, wherein each junction layer comprises an interspersed pattern of the first material and the second material; (k) forming the plurality of junction layers comprises aligning the interspersed patterns corresponding to each of plurality of junction layers; (l) forming the plurality of junction layers comprises misaligning at least some of the interspersed patterns corresponding to each of plurality of junction layers; (m) forming an insulated gate bipolar transistor (IGBT) backside structure before forming the lower drift region, the junction layer, and the upper drift region; (n) forming a metal-oxide-semiconductor field-effect transistor (MOSFET) top structure over the upper drift region; (o) forming the junction layer comprises implanting spaced interspersions of the first material and then implanting the second material around the spaced interspersions; (p) selecting a spacing between the interspersions of the first material based on a doping concentration of the second type of doping; (q) forming the junction layer comprises implanting the first and second material, and wherein forming the upper drift region comprises applying an epitaxial growth process; and (r) forming the lower drift region and the upper drift region comprises using different doping concentrations for the lower drift region and the upper drift region.

BRIEF DESCRIPTION OF THE DRAWINGS

In the drawings:

FIG. 1A is a block diagram of a first illustrative semiconductor device.

FIG. 1B is block diagram of a second illustrative semiconductor device.

FIG. 1C is a top view of an illustrative semiconductor die.

FIG. 1D is a perspective view of an illustrative packaged semiconductor device.

FIGS. 5A-5D show top views of illustrative interspersed patterns for a buried junction layer.

Figure 2A:
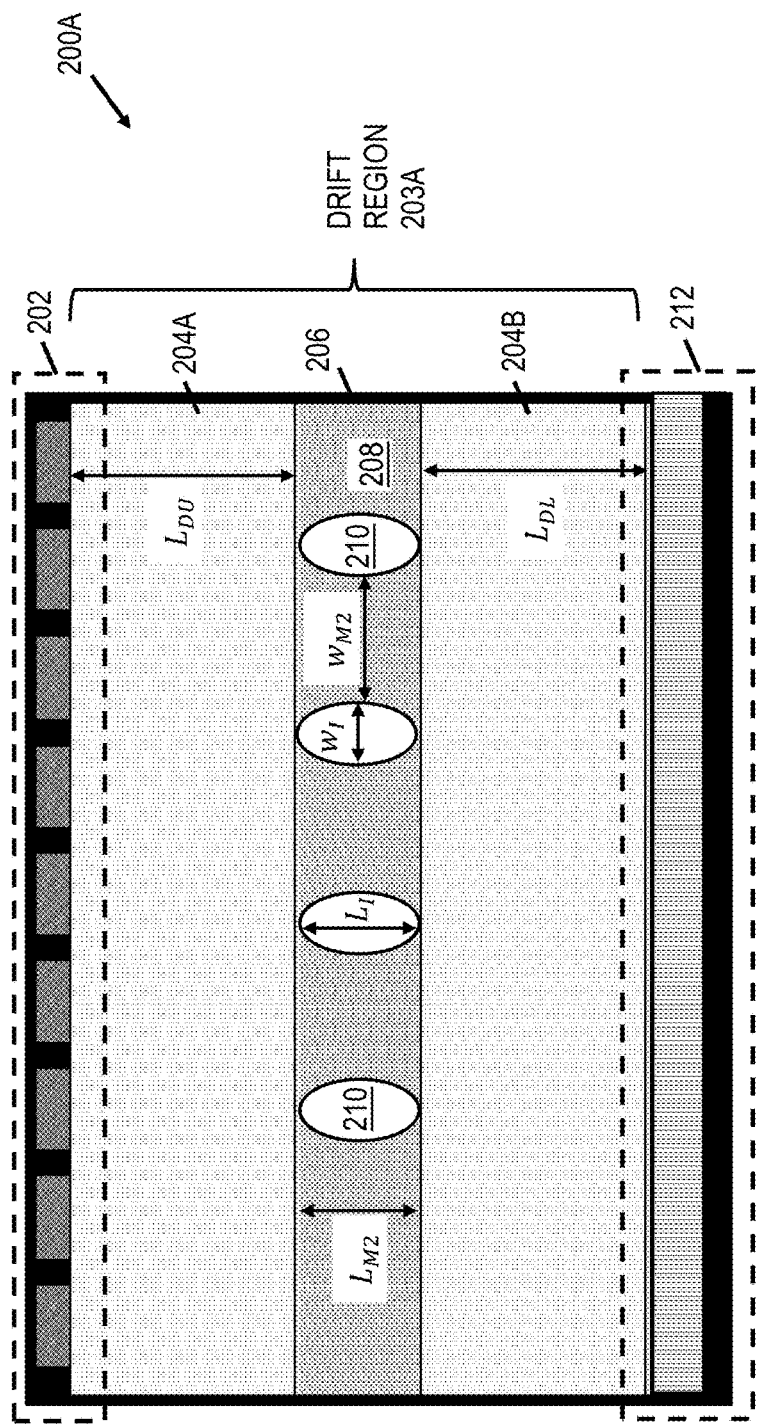
FIG. 2A is a cross-sectional view of illustrative semiconductor device.

It should be understood that the drawings and corresponding detailed description do not limit the disclosure, but on the contrary, they provide the foundation for understanding all modifications, equivalents, and alternatives falling within the scope of the appended claims.

Terminology

In the following description, "interspersed pattern" refers to a repeating or non-repeating pattern formed using at least two materials. To form an interspersed pattern, at least two spaced interspersions of a material are provided and at least one other material fills the space around the interspersions up to the boundaries of a layer associated with the interspersed pattern. Example shapes for each interspersion are islands (i.e., isolated three-dimensional shapes such as blobs, cylinders, spheres, prisms, or cubes) or grid lines (e.g., three-dimensional shapes that extend in parallel or in intersecting fashion across a layer associated with the interspersed pattern). An interspersed pattern can include different interspersion shapes and sizes. Also, the spacing between interspersions for a given layer can stay the same or can vary. Also, multiple interspersed patterns can be combined with each other and/or can overlap. A top view of a layer with an interspersed pattern of materials reveals the pattern.

Also, the terms "intrinsic", "lightly-doped", "moderately-doped", and "heavily-doped", and "degenerate" are employed to indicate relative degrees of doping. These terms are not intended to indicate definitive numerical ranges, but rather to indicate (on a logarithmic scale) approximate ranges whose upper and lower extremes may be allowed to vary by a factor of 4 in either direction. In the context of silicon, the term "intrinsic" indicates a dopant concentration of $10^{10}$ atoms/cm$^3$ or less. "Lightly-doped" indicates a concentration in the range between $10^{12}$ and $10^{14}$ atoms/cm$^3$. "Moderately-doped" indicates a concentration in the range $10^{15}$ to $10^{17}$ atoms/cm$^3$, inclusive. "Heavily-doped" indicates a concentration in the range $10^{18}$ to $10^{21}$ atoms/cm$^3$. "Degenerate" indicates a doping level sufficient to provide an osmic (non-rectifying) connection with a metal contact (generally greater than $10^{20}$ atoms/cm$^3$). Note that for semiconductors other than silicon, these ranges may vary.

DETAILED DESCRIPTION

Disclosed herein are semiconductor devices having a novel buried junction architecture and related manufacturing methods. In accordance with at least some embodiments, the disclosed buried junction architecture is part of a transistor drift region having an upper drift layer, a lower drift layer, and a buried junction layer between the upper and lower drift layers. The upper and lower drift layers have a first type of doping (i.e., p-type or n-type doping). Meanwhile, the buried junction layer comprises an interspersed pattern of a first material and a second material. The first material having a second type of doping opposite the first type of doping and the second material having the first type of doping and having a different doping concentration than the upper and lower drift layers (i.e., the second material is counter-doped relative to the first material). In some embodiments, the first material is interspersed first and then at least the second material fills the remaining space of the buried junction layer. In other embodiments, the second material is interspersed first and then at least the first material fills the remaining space of the buried junction layer. Different buried junction architecture options, including different numbers of buried junction layers, different interspersed patterns, different dopant(s) and counter-dopant(s), and different doping and counter-doping concentrations are possible. With the disclosed buried junction architecture, power loss during "on" switching ($E_{on}$) is reduced compared to other buried junction architectures, and performance degradation due to thermal cycling is reduced. Also, the interspersed pattern of the first material and the second material used for the buried junction layer can be designed to avoid or reduce current filamentation during device turn-off.

To manufacture semiconductor devices with the disclosed buried junction architecture, various operations are performed including cutting a wafer from a semiconductor crystal. The wafer serves as a substrate to which other operations are applied. The other operations may include cleaning, etching, deposition, masking, implantation, diffusion, oxidation, metallization, and passivation. The precise order (and parameters) of the operations and patterning of any masks or implants determine the structure of the resulting semiconductor device. As each device typically occupies only a small portion (a block or "die") of substrate, the operations may be designed to create many semiconductor devices at the same time. Once the sequence of processing operations is complete, the individual semiconductor devices may be tested and cut apart ("singulated").

The singulation process applies highly-localized stresses that leave residual damage along the edges of each die. Such damage unpredictably impacts the electronic properties in its vicinity and generally accelerates chemical and physical forms of degradation. To prevent such damage from affecting operation of the semiconductor devices, device designers restrict the active area of the device to the interior of the die surrounded by scribe lanes that allow for saw kerf and buffer zones. Where buffer zones are insufficient to protect the device performance from edge damage, designers must provide the active area with some form of termination that shields it. To make individual semiconductor devices even more robust, as well as making them easier to incorporate into electronic circuits, devices may be packaged.

FIGS. 1A-1D show different semiconductor device embodiments. In FIG. 1A, the semiconductor device 100A includes an N-channel insulated-gate bipolar transistor (IGBT) 102 and optional components 106. The N-channel IGBT 102 includes a buried junction layer having an interspersed pattern of doped and counter-doped materials as described herein. In different embodiments, the optional components 106 can include electrical components between any two of the terminals (gate, emitter, and collector) of the N-channel IGBT 102. Example electrical components include resistors, diodes, inductors, and/or capacitors. Such electrical components can be chip level components or external components. The optional components 106 can additionally or alternatively include packaging components, where one or more external leads are provided for each transistor terminal. In some embodiments of the semiconductor device 100A, multiple N-channel IGBTs 102 can be packaged together.

In FIG. 1B, the semiconductor device 100B includes a P-channel IGBT 104 and optional components 106. The P-channel IGBT 104 includes a buried junction layer having an interspersed pattern of doped and counter-doped materials as described herein. In different embodiments, the optional components 106 can include electrical components between two of the terminals (gate, emitter, and collector) of the P-channel IGBT 104. Example electrical components include resistors, diodes, inductors, and/or capacitors. Such electrical components can be chip level components or external components. The optional components 106 can additionally or alternatively include packaging components, where one or more external leads are provided for each transistor terminal. In some embodiments of the semiconductor device 100B, multiple P-channel IGBTs 104 can be packaged together.

FIG. 1C shows a top view of a semiconductor device 100C without packaging (i.e., a die). From the top of the semiconductor device 100C, the emitter (E) and gate (G) terminals are visible. The collector (C) terminal is at the bottom of the die. The semiconductor device 100C includes a buried junction layer having an interspersed pattern of doped and counter-doped materials as described herein. Without limitation, the semiconductor device 100C may correspond to either of the semiconductor devices 100A and 100B of FIGS. 1A and 1B.

FIG. 1D shows a semiconductor device 100D with packaging. As shown, the semiconductor device 100D includes a housing 112 and leads 114, 116, and 118 that are electrically-coupled (e.g., soldered) to terminals of a transistor die and/or other points of an internal electrical circuit. The die may be mounted on a thermally and electrically conductive tab, which is part of the housing 112. In some embodiments, the tab may serve as an electrical lead that connects to a transistor die or electrical circuit as well as providing a thermal pathway to draw heat away from the die. In accordance with at least some embodiments, the semiconductor device 100D includes a buried junction layer having an interspersed pattern of doped and counter-doped materials as described herein. Without limitation, the semiconductor device 100D may correspond to either of the semiconductor devices 100A and 100B of FIGS. 1A and 1B. As is known in the relevant art, many different package options are available with feature variations such as shape, size, number and orientation of leads, die orientation, and the number of semiconductor devices packaged together.

Figure 2B:
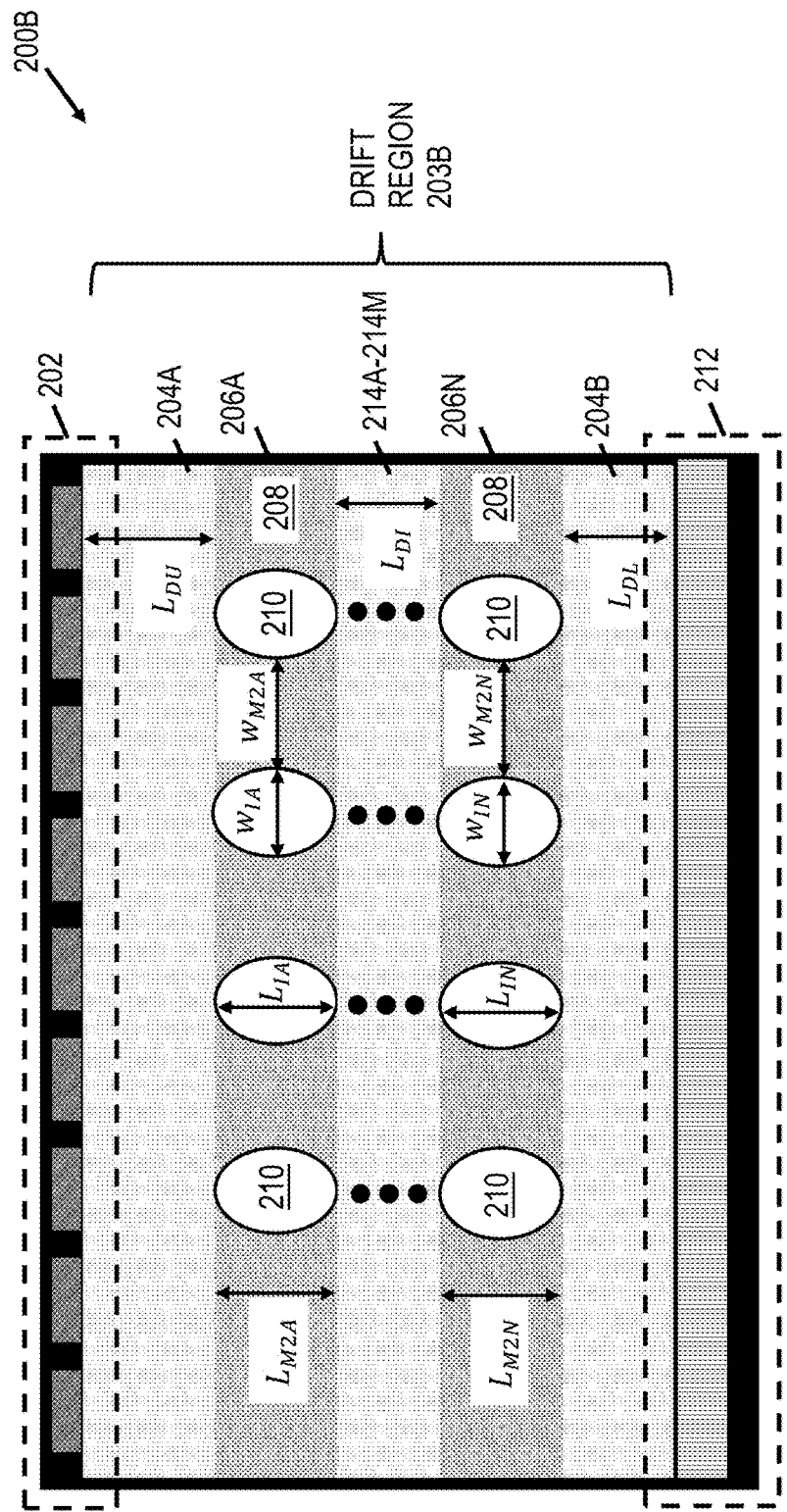
FIG. 2B is a cross-sectional view of another illustrative semiconductor device.

FIGS. 2A and 2B show cross-sectional views of illustrative semiconductor devices. In FIG. 2A, the semiconductor device 200A has a single buried junction layer 206 with an interspersed pattern of doped material 210 and counter-doped material 208. Meanwhile, the semiconductor device 200B of FIG. 2B has a plurality of buried junction layers 206A-206N, each with an interspersed pattern of doped material 210 and counter-doped material 208. More specifically, the semiconductor device 200A of FIG. 2A includes an IGBT backside structure 212, a drift region 203A, and a MOSFET top structure 202. In the embodiment represented in FIG. 2A, the drift region 203A includes a lower drift layer 204B, a buried junction layer 206, and an upper drift layer 204A. The upper and lower drift layers 204A and 204B have a first type of doping (n-type or p-type doping). Meanwhile, the buried junction layer 206 has an interspersed pattern of a first material 210 and a second material 208. The interspersed first material 210 has a second type of doping opposite the first type of doping used for the upper and lower drift layers 204A and 204B. Meanwhile, the second material 208 (counter-doped material that fills the remaining space of the buried junction layer 206) has the first type of doping, but with a concentration level that is different than the upper and lower drift layers 204A and 204B. In some embodiments, the doped first material 210 can be interspersed first and then the counter-doped second material 210 can fill in the remaining space of the buried junction layer 206. In other embodiments, the counter-doped second material 208 is interspersed first and then the doped first material 210 can fill in the remaining space of the buried junction layer 206. In some embodiments, the upper and lower drift layers 204A and 204B are both lightly doped. For example, the upper drift layer 204A may have a doping concentration of $3\times10^{13}$ atoms/cm$^3$ and the lower drift layer 204B may have a doping contraction of $1\times10^{14}$ atoms/cm$^3$.

In FIG. 2A, various parameters for the drift region 203A are given. The parameters include the length ($L_{DL}$) of the lower drift layer 204B, the length ($L_{DU}$) of the upper drift layer 204A, the length ($L_I$) of each interspersion of the first material 210 in the buried junction layer 206, the width ($w_I$) of each interspersion of the first material 210 in the buried junction layer 206, the length ($L_{M2}$) of the second material 208 around the interspersed first material 210 in the buried junction layer 206, and the spacing width ($w_{M2}$) of the second material 208 between interspersions of the first material 210. Other relevant parameters of the drift region 203A include the doping type, dopant(s), and doping concentration of the upper drift layer 204A, the lower drift layer 204B, the interspersed first material 210 used in the buried junction layer 206, and the second material 208 used in the buried junction layer 206. With the disclosed buried junction architecture (an interspersed pattern of doped and counter-doped materials), the spacing/gap between interspersions of the first material 210 can be smaller than other buried junction architectures, resulting in faster recovery of the interspersed first material 210 and therefore faster turn-on performance ($E_{on}$ is reduced). Also, the counter-doped second material 208 around interspersions of the first material 210 serves to reduce long-term spreading of the interspersed first material 210 due to thermal cycling. Thus, thermal cycling degradation of drift region 203A and buried junction layer 206 is reduced compared to other buried junction architectures.

In different embodiments, the ratio of the thickness of upper and lower drift layers 204A and 204B can be adjusted to modulate the electric field distribution during reverse bias. Also, as the lower drift layer 204B is shortened, the switching speed of the device is increased. Also, increasing the doping concentration the lower drift layer 204B can reduce ringing during turn-off. For fast switching applications, the buried junction layer 206 should be placed as near to the backside of the silicon wafer as possible without compromising reliability. Also, if the goal is to reduce the electric field near the surface of the silicon wafer the buried junction layer 206 can be placed near the surface.

In FIG. 2B, the semiconductor device 200B has a drift region 203B with upper drift layer 204A, lower drift layer 204B, a plurality of buried junction layers 206A-206N, and a plurality of intermediate drift layers 214A-214M (one between adjacent buried junction layers). In some embodiments, one or more of the intermediate drift layers 214A-214M can be omitted such that adjacent buried junction layers contact each other. Similar to the semiconductor device 200A of FIG. 2A, the semiconductor device 200B of FIG. 2B includes an IGBT backside structure 212 and a MOSFET top structure 202. However, instead of one buried junction layer 206 as is described for the semiconductor device 200A of FIG. 2A, the semiconductor device 200B of FIG. 2B includes a plurality of buried junction layers 206A-206N. In some embodiments, the buried junction layers 206A-206N can be aligned as shown such that the interspersed first material 210 of each layer is aligned. Alternatively, one or more of the buried junction layers 206A-206N can be misaligned relative to other buried junction layers. In such case, the interspersed first material 210 in a misaligned buried junction layer will be laterally offset from the interspersed first material 210 of other aligned buried junction layers. In some embodiments, the size and shape of the interspersed first material 210 can be the same for all of the buried junction layers 206A-206N. Alternatively, the size and shape of the interspersed first material 210 can vary for different buried junction layers or within a single buried junction layer.

For the semiconductor device 200B, the upper drift layer 204A, the lower drift layer 204B, and the intermediate drift layers 214A-214M have a first type of doping (n-type or p-type doping). Meanwhile, each of the buried junction layers 206A-206N has an interspersed pattern of a doped first material 210 and a counter-doped second material 208. In other words, the interspersed first material 210 has a second type of doping opposite the first type of doping used for the upper and lower drift layer 204A and 204B. Meanwhile, the second material 208 (filler material around the interspersed first material 210) has the first type of doping, but with a concentration level that is different than the upper drift level 204A, the lower drift layer 204B, and any intermediate drift layers 214A-214M. The interspersion shape, spacing, doping concentration, and dopant(s) used for the interspersed first material 210 may vary for each of the buried junction layers 206A-206N. Likewise, the doping concentration and dopant(s) used for the second material 208 may vary for each of the buried junction layers 206A-206N. Also, the particular doping concentration and dopant(s) used for the upper drift layer 204A, the lower drift layer 204B, and the intermediate drift layers 214A-214M may vary. In some embodiments, the counter-doped second material 208 can be interspersed first and then doped first material 210 can fill in the remaining space of each buried junction layer 206A-206N.

In FIG. 2B, various parameters for the drift region 203B are given. The parameters include the length ($L_{DL}$) of the lower drift layer 204B, the length ($L_{DU}$) of the upper drift layer 204A, the length ($L_{DI}$) of each intermediate drift layer 214A-214M (different lengths are possible for each layer), the length ($L_{IA}$-$L_{IN}$) of each interspersion of the first material 210 for each buried junction layer 206A-206N, the width ($w_{IA}$-$w_{IN}$) of each interspersion of the first material 210 for each buried junction layer 206A-206N, the length ($L_{M2A}$-$L_{M2N}$) of spacing material between interspersed material for each buried junction layer 206A-206N, and the spacing width ($w_{M2A}$-$w_{M2N}$) of the second material 208 between interspersions of the first material 210 for each buried junction layer 206A-206N. Other relevant parameters of the drift region 203B include the doping type, dopant(s), and doping concentration of the upper drift layer 204A, the lower drift layer 204B, the intermediate drift layers 214A-214M, the interspersed first material(s) 210 used in each of the buried junction layers 206A-206N, and the second material(s) 208 used in each of the buried junction layer 206A-206M. With the disclosed buried junction architecture of semiconductor device 200B (a plurality of buried junction layers, each with an interspersed pattern of doped and counter-doped materials), a faster recovery of the interspersed first material 210 is possible, resulting in faster turn-on performance and reduced power losses ($E_{on}$ and possibly $E_{off}$ is reduced). Also, the counter-doped second material 208 around interspersions of the doped first material 210 serves to reduce long-term spreading of the doped first material 210 due to thermal cycling. Thus, thermal cycling degradation of drift region 203B and the buried junction layers 206A-206N is reduced compared to other buried junction architectures.

During fabrication of semiconductor devices such as the semiconductor device 200A of FIG. 2A or the semiconductor device 200B of FIG. 2B, various processes may be used to form the layers discussed. For example, where it is desired, an epitaxially-grown buffer layer may be grown over which an oxide layer (i.e., silicon dioxide) is formed and a photoresist layer provided for masking. Also, ion implantation may be used to implant suitable ions. As desired, an annealing step may be performed to repair the crystalline structure and diffuse dopants. Oxides may be stripped before epitaxial layers are grown. The thickness of epitaxial layers may be adjusted to achieve a device with a different breakdown voltage. As desired, undoped or lightly-doped epitaxial layers may be used to adjust charge balancing. As another alternative, undoped or lightly-doped epitaxial layers can be replaced with a moderately doped epitaxial layer to provide charge compensation. Instead of uniform doping, a graded doping profile may be used to adjust charge balance. As desired, screen oxide and blanket implants may be used. One or more masks may be used to provide or adjust desired patterns. As needed, termination wells may be formed with ion implantation. Oxidation and annealing steps may also be used to form a "hard" oxide mask. Once the oxide is formed, the temperature may be elevated to densify the oxide, anneal the silicon material damaged by the implantation process, and diffusing dopants towards their desired depth.

Trench formation may be used as needed. For example, trenches can be formed by depositing a photoresist layer patterned to form a mask. The spacing of trenches may vary with the desired operating characteristics of the device. As desired, dry oxide etching may be applied to expose the silicon through the holes in the mask. Thereafter, a deep silicon etch is then performed to create the trenches. The trenches may extend most of the way through the epitaxial layers, leaving only a small gap between the trench bottoms and the substrate. Trench sidewalls may be smoothed as desired through the growth and removal of a sacrificial oxide layer. Trench liners and filler materials may be used as desired. If filled trenches leave depressions on the surface, these depressions may be filled with polysilicon or another suitable material for defining self-aligned gates. In a "lidless" device embodiment, depressions may be filled by oxide and no polysilicon is used.

As desired, a planarization process (e.g., chemical-mechanical planarization or "CMP") is applied to remove elevated portions of polysilicon or oxide. Etching is applied as desired to expose a nitride layer and create a cavity for a recessed gate in the trenches. Any polysilicon lids and nitride layers may be retained or removed as desired. Annealing is performed as needed to cure any damage to the gate oxide. Gates are formed from a layer of polysilicon. For example, a CMP operation may be applied to remove the elevated portions of a layer, and leaving only the recessed portions as gates. Other steps include forming body wells and source implants using ion implantation. As desired, a photoresist layer may be deposited and patterned to protect the other regions of the device (i.e., periphery and termination regions) before the ion implantation. The photoresist may be stripped and the device subjected to an annealing operation.

After the creation of body well and/or source implants, a polysilicon recess etch may be used to remove the upper portion of the gates, making the gates recessed slightly below the surface of the silicon. A seal layer may then be provided to protect the semiconductive portions of the device. As desired, an inter-layer dielectric layer may also be formed, where a sputter etch or other planarization technique may be applied to smooth corners and edges on the upper surface of the dielectric layer. Over the interlayer dielectric, a photoresist layer is deposited and patterned to define contact zones. An etch process is used to remove the interlayer dielectric and any seal layer, thereby exposing the silicon or polysilicon gate material where it is desired to create electrical contacts. A dry silicon etch may be used to recess the silicon contact regions, preferably far enough to penetrate any source implants. Body contact implants may be formed by ion implantation in the exposed silicon of the contact zones. The photoresist may be stripped and an annealing operation applied. Any oxide formed by the annealing operation is removed before the metal contacts are formed. In at least some embodiments, the metal contacts are formed with thin layers of titanium and titanium nitride, which are annealed to form silicide where these layers contact the silicon. As desired, thicker layers of tungsten and aluminum may be applied and patterned to form the transistor electrodes (terminals). With suitable care in the design, the terminals and can reside within a single metallization layer that is formed across the surface before being patterned via photoresist-guided etching. In at least some embodiments, a passivation layer may be formed across the surface of the device and patterned via photoresist-guided curing. Portions of the gate and emitter terminals of the semiconductor device 200A are left exposed for connection to external device leads. The reverse side of the semiconductor device 200A may be provided with a collector terminal.

In accordance with at least some embodiments, manufacturing each buried junction layer 206 involves use of a pattern to implant the desired implant species and then a thick epi layer is grown above the implanted buried layer. The new epi layer becomes the top part of the overall device's drift region. Use of buried layer implants and thick epi layers (e.g. 30 to 70 um) increases the difficulty of aligning top layers to the buried layer. As desired, such alignment issues can be solved with front to back alignment photo capable tools. Also, in at least some embodiments, alignment tolerances are not considered critical and so only crude wafer alignment is sufficient.

Figure 3:
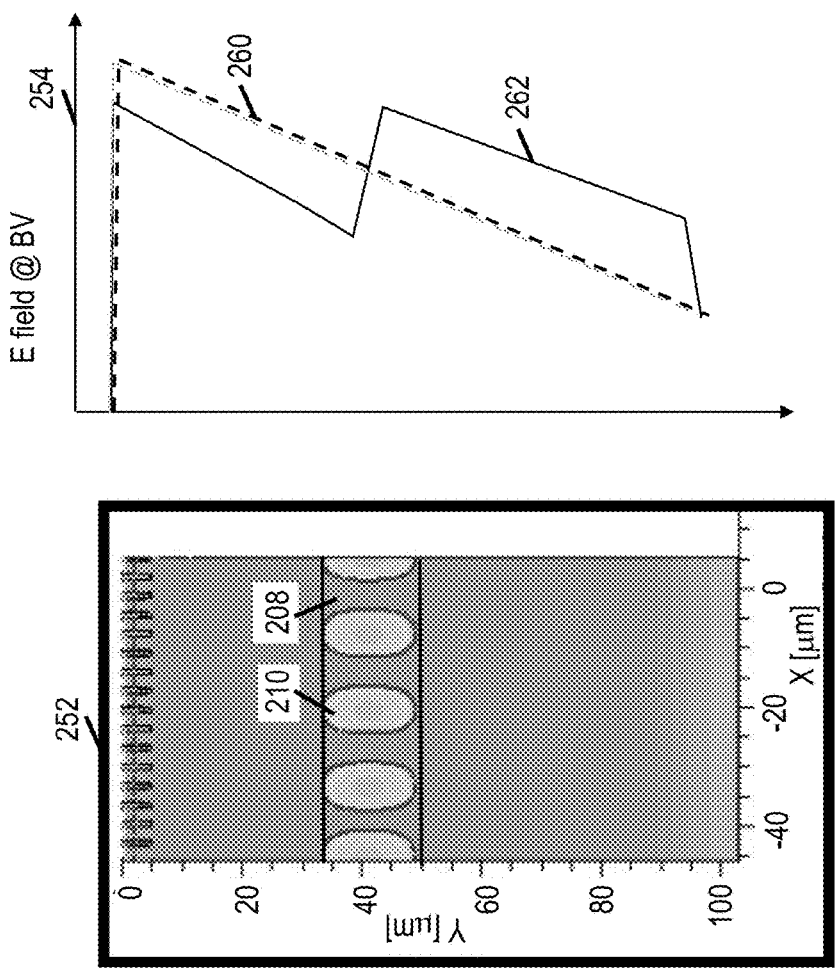
FIG. 3 shows a cross-sectional view of an illustrative semiconductor device and a corresponding electric field graph.

FIG. 3 shows a cross-sectional view 252 of an illustrative semiconductor device and a corresponding electric field graph 254. In the cross-sectional view 252, the represented semiconductor device includes a buried junction layer with an interspersed pattern of a doped material (e.g., first material 210) and a counter-doped material (e.g., second material 208) as described herein. Without limitation to other embodiments, the approximate overall length of the represented semiconductor device is 100 μm and the approximate length of the buried junction layer is 20 μm. In the graph 254, a first line 260 (the dashed line) and a second line 262 (the solid line) are shown. The first line 260 represents the electric field in a drift region for a semiconductor device without a buried junction layer. Meanwhile, the second line 262 represents the electric field in a drift region for a semiconductor device with a buried junction layer as described herein. With the buried junction layer as described herein, punch through for a corresponding semiconductor device is faster than for a standard semiconductor device. Also, the overall length of a drift region (e.g., drift region 203A) for a semiconductor device with a buried junction layer as described herein can be reduced compared to the drift region of a standard semiconductor device.

Figure 4A:
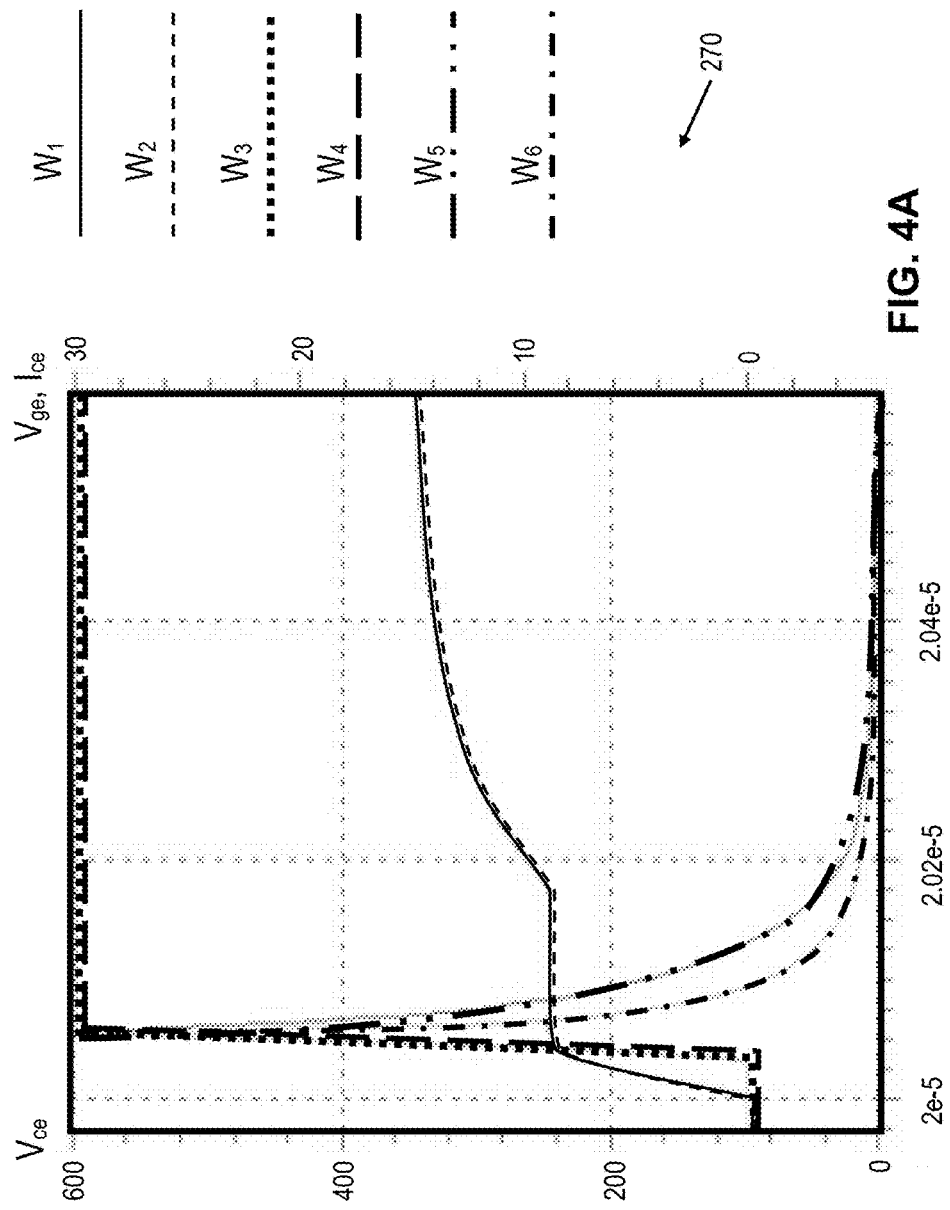
FIG. 4A shows a graph of illustrative turn-on waveforms related an illustrative semiconductor device.

FIG. 4A shows a graph of illustrative turn-on waveforms ($W_1$-$W_6$) related to an illustrative semiconductor device versus a legacy semiconductor device. $W_1$ corresponds to the gate voltage of an IGBT device without a buried junction layer (e.g., without the buried junction architecture described herein). $W_2$ corresponds to the gate voltage of an IGBT device with the buried junction architecture described herein. $W_3$ corresponds to the turn-on current ($I_{ce\_ON}$) of an IGBT device without a buried junction layer. $W_4$ corresponds to the turn-on current ($I_{ce\_ON'}$) of an IGBT device with the buried junction architecture described herein. $W_5$ corresponds to the turn-on voltage ($V_{ce\_ON}$) of an IGBT device without a buried junction layer. $W_6$ corresponds to the turn-on voltage ($V_{ce\_ON'}$) of an IGBT device with the buried junction architecture described herein. As shown in FIG. 4A, $V_{ce\_ON'}$ drops more quickly than $V_{ce\_ON}$, resulting in devices with the disclosed buried junction architecture having reduced turn-on power loss ($E_{on}$) than legacy devices.

Figure 4B:
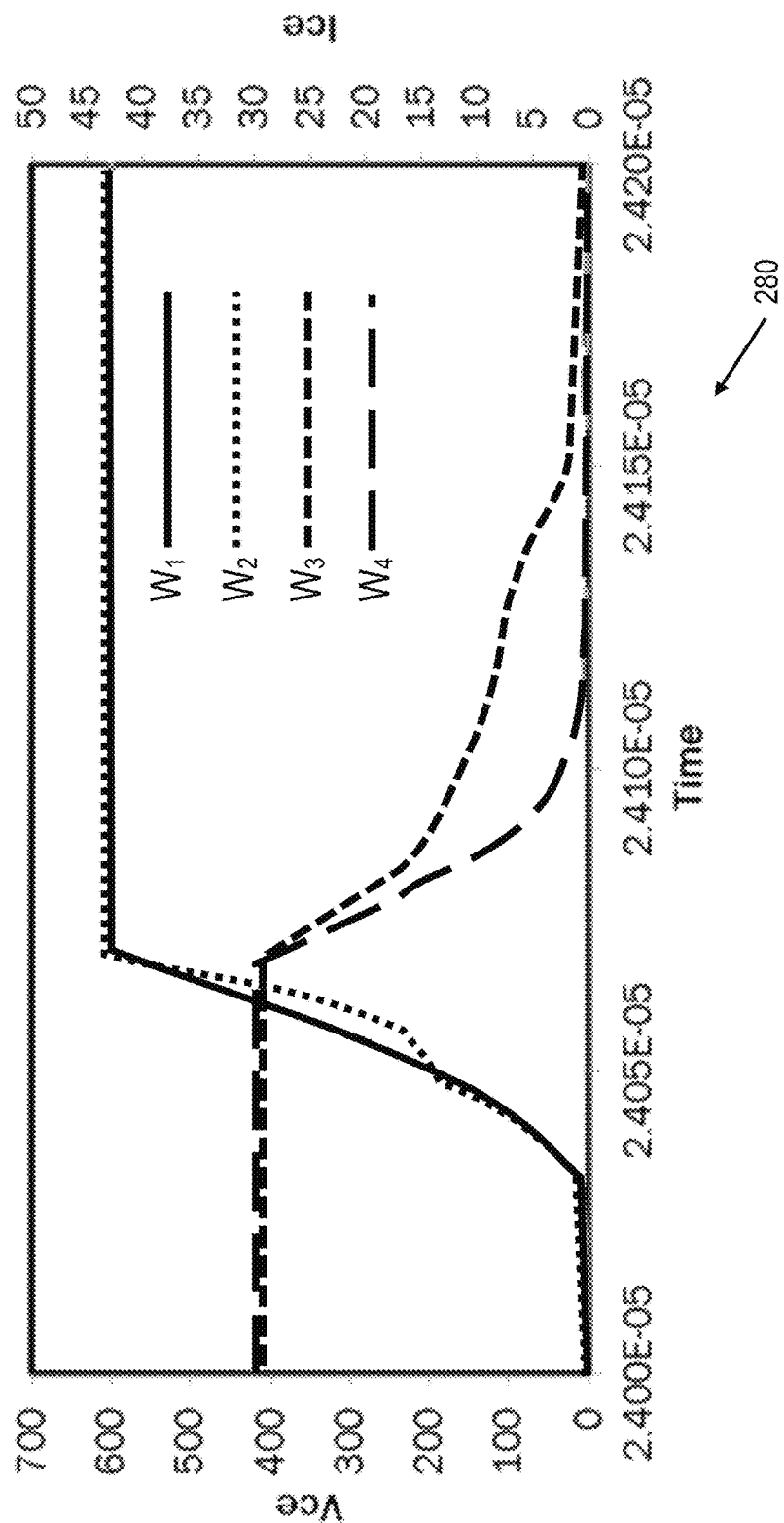
FIG. 4B shows a graph of illustrative turn-off waveforms related an illustrative semiconductor device.

FIG. 4B shows a graph of illustrative turn-off waveforms ($W_1$-$W_4$) related to an illustrative semiconductor device versus a legacy semiconductor device. $W_1$ corresponds to the turn-off voltage ($V_{ce\_OFF}$) of an IGBT device without a buried junction layer (e.g., without the buried junction architecture described herein). $W_2$ corresponds to the turn-off voltage ($V_{ce\_OFF'}$) of an IGBT device with the buried junction architecture described herein. $W_3$ corresponds to the turn-off current ($I_{ce\_OFF}$) of an IGBT device without a buried junction layer. $W_4$ corresponds to the turn-off current ($I_{ce\_OFF'}$) of an IGBT device with the buried junction architecture described herein. As shown in FIG. 4B, $I_{ce\_OFF'}$ drops more quickly than $I_{ce\_OFF}$, resulting in devices with the disclosed buried junction architecture having reduced turn-off power loss ($E_{off}$) than legacy devices.

FIGS. 5A-5D show top views of illustrative interspersed patterns for a buried junction layer. In FIG. 5A, interspersions of the doped first material 210A have a round or cylindrical shape and the counter-doped second material 208A fills the remaining space of the corresponding buried junction layer. In FIG. 5B, interspersions of the counter-doped second material 208B have a round or cylindrical shape, and the doped first material 210B fills the remaining space of the corresponding buried junction layer. If FIG. 5C, interspersions of the doped first material 210C have a square or cube shape and the counter-doped second material 208C fills the remaining space of the corresponding buried junction layer. If FIG. 5D, interspersions of the counter-doped second material 208D have a square or cube shape and the doped first material 210D fills the remaining space of the corresponding buried junction layer. To achieve the patterns of FIGS. 5A-5D, a combination of blanket implants and masked implants can be used.

The patterns illustrated in FIGS. 5A-5D are examples only and are not intended to limit buried junction layers to a particular pattern. In different embodiments, the size, shape, dopant(s), doping concentration, and/or other attributes of interspersions and filler material(s) can vary. Also, the spacing between interspersions for a given layer can stay the same or can vary throughout the layer. As an example, in the edge termination area (the area that surrounds active cell (region) and terminates the electric field), the spacing for interspersions can be increased relative to interspersions in the active cell. In some embodiments, as interspersions move away from the active region, the spacing can continue to increase (increasing as a function of distance from the active region). Meanwhile, the spacing between interspersions within the active region may be constant.

As shown in FIGS. 5A-5D, interspersions in a buried junction layer may correspond to doped or counter-doped materials. Once interspersions of a particular doping type are formed, the remaining space of a buried junction layer is filled with at least one other material having an opposite doping type. More complex patterns are possible using three or more materials rather than two materials. While the patterns represented in FIGS. 5A-5D are shown to be uniform and/or symmetrical, such uniformity and symmetry is not a requirement. Also, it should be understood that doping concentrations can vary (e.g., a graded doping profile may be used for interspersions and/or the filler material(s)).

Figure 6:
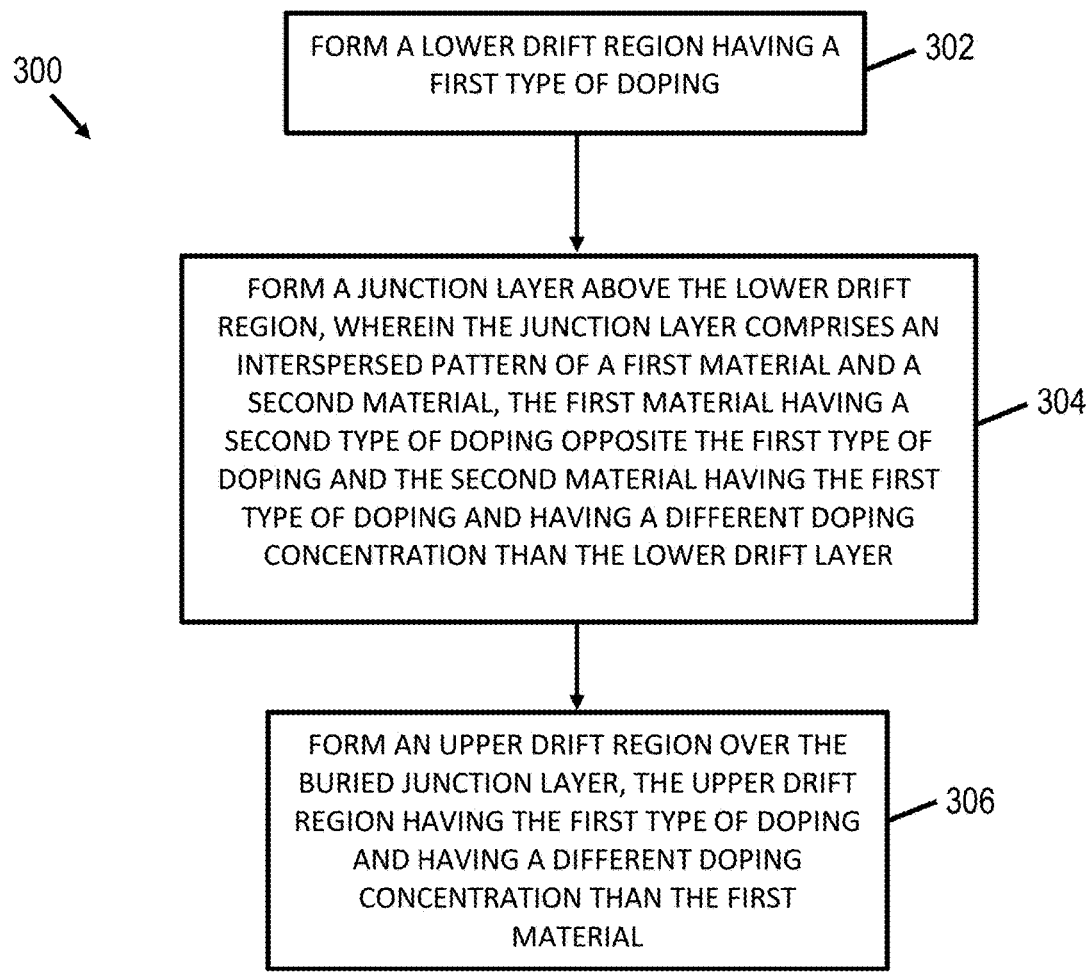
FIG. 6 shows a flowchart of an illustrative semiconductor device manufacturing method. levels related to an illustrative semiconductor device.

FIG. 6 shows a flowchart of an illustrative semiconductor device manufacturing method 300. As shown, the method 300 includes forming a lower drift region (e.g., layer 204B) having a first type of doping at block 302. At block 304, a junction layer (e.g., layer 206) is formed above the lower drift region, where the junction layer has an interspersed pattern of a first material and a second material. The first material has a second type of doping opposite the first type of doping. Meanwhile, the second material has the first type of doping and has a different doping concentration than the lower drift layer. At block 306, an upper drift layer (e.g., layer 204A) is formed over the junction layer, where the upper drift layer has the first type of doping and has a different doping concentration than the first material of the junction layer. In at least some embodiments, the method 300 may include additional steps related to forming the drift region and/or other layers of a semiconductor device. For example, the junction layer formed in block 304 may vary with regard to the interspersed pattern, the materials used, the order in which materials are added to the junction layer, the dopant(s) and counter dopant(s) used, and/or the concentration of the dopant(s) and counter dopant(s) used. Also, in some embodiments, multiple junction layers and intermediate drift layers are formed as described herein. Also, the upper and lower drift regions may vary with regard to at least the dopant(s) used and the concentration of dopant(s). Also, various drift region parameters (e.g., $L_{DL}$, $L_{DU}$, $L_I$, $w_I$, $L_{M2}$, $w_{M2}$, $L_{I4}$-$L_{IN}$, $w_{I4}$-$w_{IN}$, $L_{M2A}$-$L_{M2N}$, and/or $w_{M2A}$-$w_{M2N}$) may vary for different embodiments. The operations of blocks 302, 304, 306 and/or other steps related to manufacturing a semiconductor device as in method 300 may include wafer preparation, cleaning, etching, deposition, masking, implantation, diffusion, oxidation, metallization, passivation, and packaging. The method 300 can be automated and embodied in a semiconductor processing system or assembly line. The resulting semiconductor device may correspond to a packaged or unpackaged n-channel IGBT, a packaged or packaged p-channel IGBT, or another semiconductor device with a buried junction layer having an interspersed pattern of doped and counter-doped materials.

With the disclosed buried junction architecture, the electric field distribution in the draft region can be controlled to increase the breakdown voltage. Also, interspersions can be provided by implant before epi regrowth of the rest of the drift region in order to have tighter spacing of interspersions and/or smaller interspersions for faster turn-on. As desired, the upper and lower drift regions can have varied length and doping to achieve: (a) less current tail; (b) optimization of edge termination; and/or (c) reduced peak electric field under the trench gate. Also, the disclosed buried junction architecture can enable a reduction in the overall length of the drift region relative to a homogeneous drift region. The disclosed buried junction architecture also benefits from low doping sensitivity with regard to the breakdown voltage compared to super junction architectures. In addition, alignment of drift layers and/or buried junction layers is not required. Accordingly, the top MOSFET structure and the drift region can be decoupled.

These and numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. A semiconductor device that comprises:
   three terminals;
   a drift region between two of the terminals, wherein the drift region includes an upper drift layer, a lower drift layer, and
   a plurality of buried junction layers between the upper and lower drift layers, with an intermediate drift layer separating each pair of adjacent buried junction layers,
   wherein the upper and lower drift layers have a first type of doping,
   wherein each buried junction layer comprises an interspersed pattern of a first material and a second material, the first material having a second type of doping opposite the first type of doping and the second material having the first type of doping and having a different doping concentration than the upper and lower drift layers, and
   wherein the interspersed patterns corresponding to the plurality of buried junction layers are not aligned.

2. The semiconductor device of claim 1, wherein the interspersed pattern comprises spaced islands of the first material separated by the second material.

3. The semiconductor device of claim 1, wherein the interspersed pattern comprises spaced lines of the first material separated by the second material.

4. The semiconductor device of claim 3, wherein at least some of the spaced lines intersect each other.

5. A semiconductor device that comprises:
   three terminals;
   a drift region between two of the terminals, wherein the drift region includes an upper drift layer, a lower drift layer, and a buried junction layer between the upper and lower drift layers,
   wherein the upper and lower drift layers have a first type of doping, and
   wherein the buried junction layer comprises an interspersed pattern of a first material and a second material, the first material having a second type of doping opposite the first type of doping and the second material having the first type of doping and having a different doping concentration than the upper and lower drift layers,
   wherein the spacing of interspersions within an active region is constant, and wherein the spacing of interspersions outside the active region is increased relative the spacing of interspersions within the active region.

6. The semiconductor device of claim 5, wherein the spacing of interspersions outside an active region continually increases as a function of distance from the active region.

* * * * *